United States Patent [19]

Shepherd, Jr. et al.

[11] Patent Number: 4,531,055
[45] Date of Patent: Jul. 23, 1985

[54] SELF-GUARDING SCHOTTKY BARRIER INFRARED DETECTOR ARRAY

[75] Inventors: Freeman D. Shepherd, Jr., Chelmsford; Paul W. Pellegrini, Bedford; Charlotte E. Ludington, Sherborn; Melanie M. Weeks, Fitchburg, all of Mass.

[73] Assignee: The United States of America as represented by the Secretary of the Air Force, Washington, D.C.

[21] Appl. No.: 455,677

[22] Filed: Jan. 5, 1983

[51] Int. Cl.³ .............................................. H01J 40/14
[52] U.S. Cl. ................................. 250/211 J; 250/578
[58] Field of Search ............... 357/15, 71, 29, 30, 357/32, 52-54; 250/211 J, 578, 332, 330, 338

[56] References Cited

U.S. PATENT DOCUMENTS

| | | | |
|---|---|---|---|
| 3,808,435 | 4/1974 | Bate et al. | 250/332 |
| 3,821,772 | 6/1974 | Zwernemann | 357/1 |
| 3,902,066 | 8/1975 | Roosild et al. | 250/332 |
| 4,024,564 | 5/1977 | Shimada et al. | 357/53 |
| 4,032,952 | 6/1977 | Ohba et al. | 357/15 |
| 4,063,964 | 12/1977 | Peressini et al. | 148/1.5 |
| 4,240,843 | 12/1980 | Celler et al. | 148/1.5 |
| 4,261,095 | 4/1981 | Dreves et al. | 29/571 |
| 4,290,077 | 9/1981 | Ronen | 357/41 |
| 4,327,291 | 4/1981 | Chapman et al. | 250/332 |
| 4,358,782 | 11/1982 | Takasuka et al. | 357/15 |
| 4,379,232 | 4/1983 | Hopper | 250/332 |
| 4,398,344 | 8/1983 | Gould | 357/15 |
| 4,471,371 | 9/1984 | Hamano | 357/30 |

*Primary Examiner*—David C. Nelms
*Attorney, Agent, or Firm*—Donald J. Singer; Richard J. Donahue

[57] ABSTRACT

A two dimensional focal plane array of Schottky photodiodes on a silicon substrate for infrared imaging. The array is designed for mating with multiplexing circuitry and has a self-guarding feature wherein adjacent Schottky electrodes act as guard electrodes. This feature allows a substantial increase of the focal plane area coverage ratio.

7 Claims, 7 Drawing Figures

SELF-GUARDING SCHOTTKY BARRIER INFRARED DETECTOR ARRAY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a sensing surface, or focal plane, for an infrared camera. More particularly, the present invention relates to a hybrid focal plane array formed of densely packed, self guarded Schottky infrared internal emission photodiodes.

In U.S. Pat. No. 3,902,066, issued Aug. 26, 1975 to Roosild et al, there is described a monolithic Schottky barrier array for detecting the infrared portion of the electromagnetic spectrum. Individual Schottky electrodes within the array are connected through enhancement mode field effect transistors to charge coupled devices for providing signals to an infrared vidicon camera. The performance of this array has proven to be limited by aliasing and drop-out effects which are related to the low percentage active area of the array. Space is required within the focal plane for multiplexing the signals derived from the individual Schottky electrodes, and also for the guard rings which are provided about each individual Schottky electrode. In such an array, the charge coupled device signal readout circuitry occupies up to 50% of the focal plane area. Add to this the losses of sensing area because of guard rings and channel stops and the active area of the array is reduced to approximately 30 to 45 percent of the total area of the array.

An improvement has been made upon the aforementioned prior art array by Charlotte E. Ludington, a coinventor in the present patent application, and a separate patent application entitled "Hybrid Schottky Infrared Focal Plane Array," bearing Ser. No. 455,715, has been filed thereon. The Ludington patent application discloses a design for an infrared internal emission Schottky array that is compatible with hybrid bump bonding techniques as known in the prior art and shown, for example, in U.S. Pat. No. 3,808,435 issued to Robert T. Bate et al. This structure increases the active area of the array to about 70% of the total area but still leaves blind spots in the array because of the areas occupied by the guard rings which surround the individual Schottky cells.

SUMMARY OF THE INVENTION

In accordance with the present invention, it has been found that an infrared focal plane mosaic having near 100% active area as well as good electrical and sensing properties can be realized by fabrication of a densely packed two-dimensional array of Schottky metal photoemission electrodes on a semiconductor focal plane substrate. The Schottky electrodes are spaced close enough for their depletion regions to overlap. This close spacing reduces the electric field intensity at the edge of the electrodes and eliminates the need for conventional guard rings in the focal plane, thus eliminating a major active area loss factor. Depletion field merger cannot be exploited in conventional infrared detector arrays, which sense radiation in the semiconductor rather than the metal, because such merger would erase the image information. The perimeter of the array can be similarly guarded with a closely spaced picture frame Schottky electrode. Signal multiplexing and readout is accomplished by the use of a second semiconductor substrate, as known in the prior art for detector arrays which sense infrared radiation in the semiconductor such as HgCdTe. The use of self-guarding simplifies the mosaic architecture and reduces the number of fabrication steps and lithographic masks required; thus, both increased production yield and reduced costs are realized.

Accordingly, the primary object of this invention is to provide an improved Schottky barrier focal plane array.

A further object of this invention is to provide a Schottky barrier focal plane array with an increased active sensing area.

Another object of this invention is to provide simplified array fabrication and reduced array cost through use of self guarding wherein metal electrode Schottky devices are placed close enough to each other to suppress high fields and edge breakdown effects.

Still another object of this invention is to provide mosaic perimeter edge breakdown protection by means of a picture frame Schottky electrode close enough to the photodiode array to provide mutual self-guarding.

These and other advantages, features and objects of this invention will become more apparent from the following description when taken in connection with the illustrative embodiments in the accompanying drawings.

DESCRIPTION OF THE PREFERRED EMBODIMENT

Figure 1:
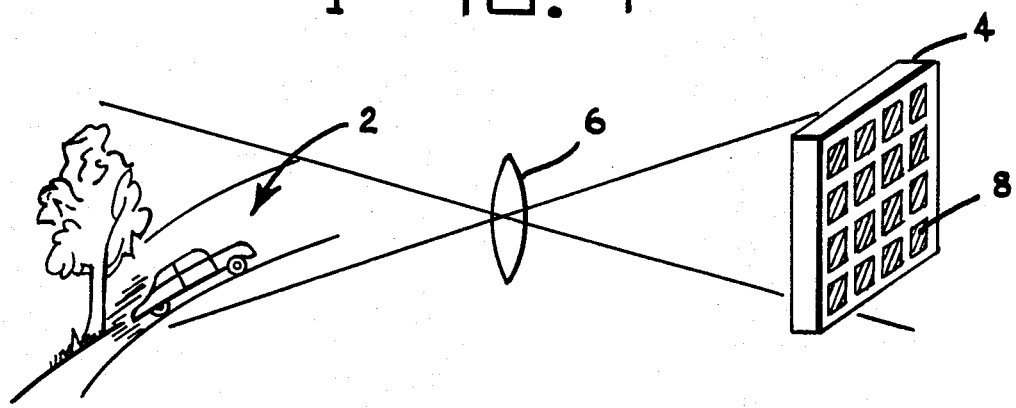
FIG. 1 is a pictorial representation of the basic elements of an infrared camera system.

Referring now to FIG. 1 of the drawings, there is shown a pictorial representation of the basic elements of a camera for infrared imaging wherein an infrared scene 2 is projected onto a semiconductor focal plane 4 by means of optics 6. Focal plane 4 includes an array of infrared sensitive photodiodes 8 in a two dimensional mosaic pattern. During an exposure or frame time a charge image is built up on the mosaic that is a replica of the observed scene. At the end of the frame, the charge image is read out as a video signal by means well known in the art.

Figure 2:
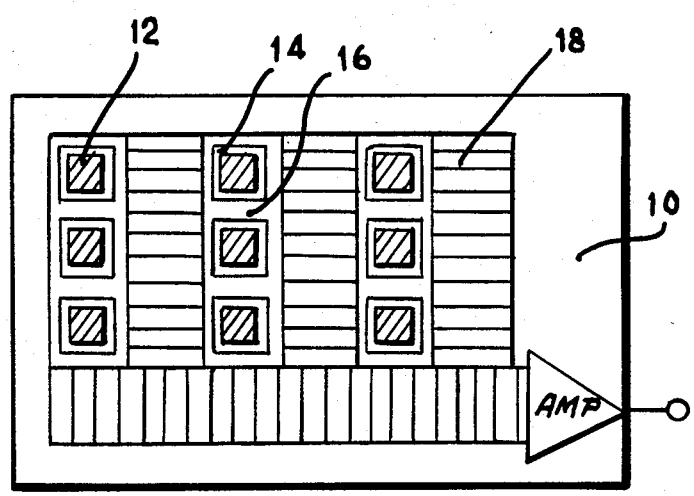
FIG. 2 is a diagrammatic representation of prior art Schottky infrared focal plane array.

FIG. 2 represents the component layout configuration of a prior art Schottky infrared focal plane array 10 such as that shown in U.S. Pat. No. 3,902,066 mentioned above. This is a monolithic device in which both sensing and multiplexing takes place within the focal plane.

The array includes a number of infrared detectors 12, each having a guard ring 14 thereabout to minimize edge breakdown leakage. Channel stops 16 are used to isolate individual photodiodes from each other and from the charge coupled multiplexer network 18 which is used for signal readout. In such prior art devices, the charge coupled devices alone utilize up to 50% of the focal plane area. In addition, the guard rings and channel stops further reduce the useable area of the array to approximately 35 percent.

Figure 3:
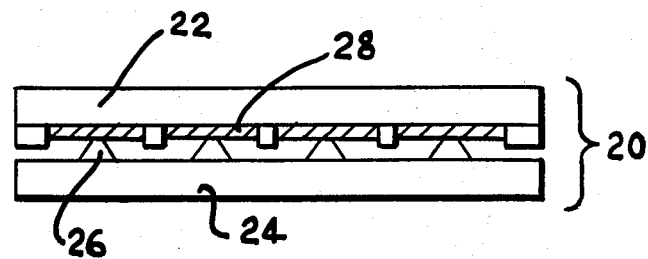
FIG. 3 is a diagrammatic representation of a hybrid focal plane array.

FIG. 3 represents a hybrid focal plane array assembly 20 in which a simple Schottky focal plane array 22 is bump-bonded to a separate multiplexer chip 24. An array having this structure is described in the Ludington patent application mentioned above. Methods of making suitable bump bonds 26 to the Schottky photodiodes 28 are known in the art.

Figure 4:
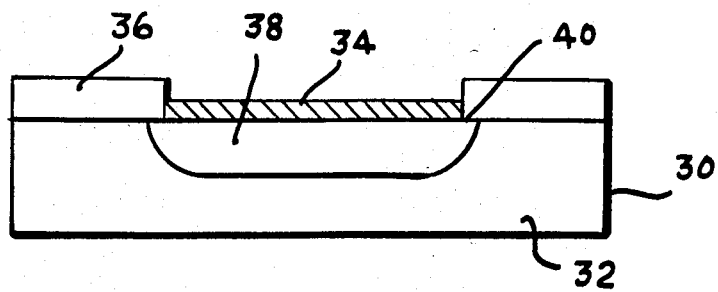
FIG. 4 is a diagrammatic representation of a basic Schottky photodiode without a guard ring.

FIG. 4 represents the schematic of a basic Schottky photodiode 30 including a substrate semiconductor 32, a Schottky metal photoelectrode 34 and an insulator 36. When the photodiode is fabricated, the differences in chemical potential between the metal and the semiconductor causes free charge to be swept from the semiconductor region that is immediately adjacent to the electrode. This process creates both the Schottky potential barrier at the metal-semiconductor interface and a high field depletion region 38 in the semiconductor. Electric field strengths at the edge of the Schottky electrode 40 can be extremely high and it is in this region where most device limiting dark currents and breakdown effects occur.

Figure 5:
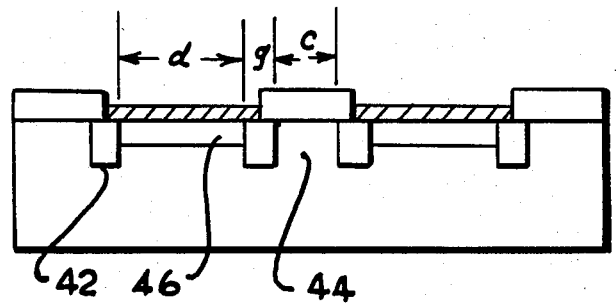
FIG. 5 is a diagrammatic representation of prior art Schottky photodiodes having guard rings.

FIG. 5 illustrates the conventional means for eliminating edge related dark currents. Guard rings 42 are formed by means of impurity diffusion or ion implantation at the edges of the photoelectrodes. Further, to prevent short circuiting between adjacent electrodes, a space or channel stop 44 is provided between guard rings. The depletion region is now confined to the area 46. As illustrated in FIG. 5, for a detector active area having dimension d, a guard ring width g, and a channel stop width c, the mosaic percent active area will be:

$$100 \times d^2/(d+2g+c)^2$$

It can therefore be seen that the use of guard rings greatly restricts the focal plane percent active area, particularly where the center to center distances of detectors is small.

Figure 6:
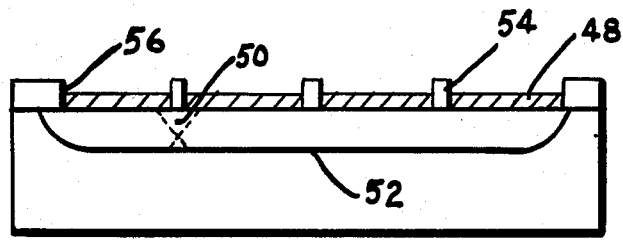
FIG. 6 is a diagrammatic representation of Schottky photodiodes having the self-guarding feature of the present invention.

In FIG. 6, the self guarding technique of the present invention is illustrated. Here the individual Schottky electrodes 48 are placed so close that their individual depletion regions 50 merge. The combined depletion field 52 becomes continuous and edges of individual depletion regions no longer come to the surface between adjacent electrodes 48. The electric field at the inner electrode edges 54 is thereby reduced. As a result, leakage currents at electrode edges are eliminated and mosaics can be operated at useful voltages (10 to 30 volts) without exhibiting breakdown. There is no loss of image when the depletion regions merge because, in the case of Schottky internal emission sensors, the signal is entirely on the metal electrodes 48. Electrodes spacing of less than 5 micrometers has been found effective for such self-guarding. By eliminating guard rings, the percent active area becomes:

$$100 \times d^2/(d+c)^2$$

It can be seen that this self-guarding technique is substantially more area efficient than the conventional guard ring technique shown in FIG. 5. A second advantage of self guarding is the simplification of focal plane fabrication. The conventional guard ring architecture requires both additional photolithographic masks and additional processing steps. Also, greater processing precision is required in the prior art designs in order to align the Schottky electrode edges with the center of the guard ring. No alignment is required in the present invention illustrated in FIG. 6.

Figure 7:
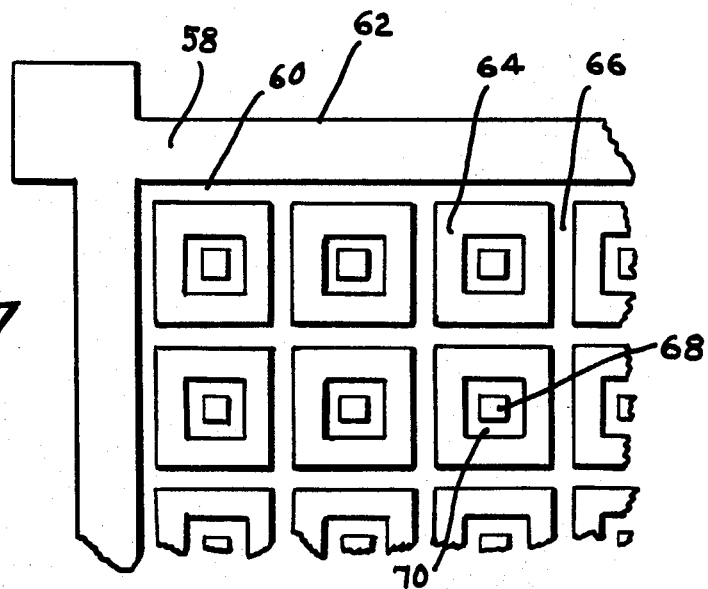
FIG. 7 is a diagrammatic representation of a portion of a self-guarded Schottky focal plane array.

The preferred embodiment of a portion of a self guarded Schottky hybrid focal plane array is shown in FIG. 7. Here, the outer Schottky electrodes are surrounded by a picture frame perimeter Schottky electrode 58 which is separated from the array by 1 to 5 micrometers. Self-guarding will now occur at the array perimeter 60. It should be noted that leakage is possible at the outer edge 62 of the perimeter Schottky electrode. This leakage can be diverted to the substrate and will not impact imaging performance. Alternately, such leakage can be eliminated by use of a conventional guard ring along the outer edge 62 of the Schottky perimeter electrode 58 without degrading focal plane area coverage. Schottky photoelectrodes 64 are separated by very narrow gaps 66 on the order of 1 to 5 micrometers. The Schottky electrode array and the perimeter electrode 58 each provide mutual self-guarding action by overlap of their depletion fields. Both the array and picture frame electrode can be fabricated with one metal evaporation. To complete focal plane fabrication, oxide feedthroughs 68 connect to bump landing pads 70 and substrate ohmic contacts are added by means well known in the semiconductor art. A second semiconductor substrate containing multiplexing circuitry is then bonded to each of the bump landing pads 70. The semiconductor base material of the present invention is preferably silicon while the Schottky electrodes are preferably formed of platinum silicide or other metallic silicides.

Although the invention has been described with reference to a particular embodiment, it will be understood to those skilled in the art that the invention is capable of a variety of alternative embodiments within the spirit and scope of the appended claims.

What is claimed is:

1. A Schottky infrared internal photoemission focal plane array having architecture for maximizing the photosensitive area of said array comprising:
   a first semiconductor substrate; and
   a plurality of metallic photoemission elements disposed on a surface of said substrate forming a two dimensional matrix of Schottky barrier photodiodes on said substrate;
   said Schottky diodes being spaced at a distance within which their individual depletion regions overlap and merge to create a continuous depletion field below the surface of said substrate, thereby suppressing the high fields which occur when depletion region edges are permitted to meet said surface of said substrate, and resulting in the suppression of dark currents and breakdown effects in said array.

2. A focal plane array as set forth in claim 1 wherein the spacing between adjacent ones of said Schottky diodes does not exceed five micrometers.

3. A focal plane array as set forth in claim 2 and further comprising:

a Schottky perimeter electrode surrounding the matrix of photodiodes and separated by no more than five micrometers therefrom.

4. A focal plane array as set forth in claim 3 and further comprising:

a second semiconductor substrate having signal multiplexing circuitry formed thereon, said second semiconductor substrate being positioned adjacent said first semiconductor substrate and bonded thereto at each of said Schottky photodiodes.

5. A focal plane array as set forth in claim 4 wherein said first and second substrates are each formed of silicon material.

6. A focal plane array as set forth in claim 5 wherein said metallic elements are formed of metal silicides.

7. A focal plane array as set forth in claim 3 and further comprising:

a single guard ring surrounding said Schottky perimeter electrode.

* * * * *